United States Patent
Kamali et al.

[11] Patent Number: 6,097,250
[45] Date of Patent: Aug. 1, 2000

[54] AMPLIFIER CIRCUIT

[75] Inventors: Walid Kamali, Duluth; Saleh R. Al-Araji, Alpharetta, both of Ga.

[73] Assignee: Scientific-Atlanta, Inc., Norcross, Ga.

[21] Appl. No.: 09/296,978

[22] Filed: Apr. 22, 1999

[51] Int. Cl.[7] ................................................. H03F 3/68
[52] U.S. Cl. ..................................... 330/124 R; 330/301
[58] Field of Search ............................... 330/124 R, 195, 330/301, 302, 276, 150; 333/25, 124

[56] References Cited

U.S. PATENT DOCUMENTS

| | | | |
|---|---|---|---|
| 3,403,357 | 9/1968 | Rosen et al. | 333/24 |
| 3,423,688 | 1/1969 | Seidel | 330/53 |
| 4,392,252 | 7/1983 | Cluniat | 455/116 |
| 5,017,886 | 5/1991 | Geller | 330/277 |
| 5,081,425 | 1/1992 | Jackson et al. | 330/207 P |
| 6,028,485 | 2/2000 | Sigmon et al. | 330/295 |

*Primary Examiner*—Robert Pascal
*Assistant Examiner*—Henry Choe
*Attorney, Agent, or Firm*—Kelly A. Gardner; Kenneth M. Massaroni; Hubert J. Barnhardt, III

[57] ABSTRACT

An amplifier circuit (400) includes an input port (402) for receiving a signal and a first balun (404) for splitting the signal into first and second signals. First and second amplifiers (406, 408) are coupled to outputs of the first balun (404) for respectively amplifying the outputs of the first balun (404) to generate first and second amplified signals. Second and third baluns (410, 412) are coupled, respectively, to outputs of the first and second amplifiers (406, 408) for splitting, respectively, each of the first and second amplified signals into in-phase and out-of-phase components. The amplifier circuit (400) also includes third and fourth amplifiers (414, 416) coupled to outputs of the second balun (410) for respectively amplifying the outputs of the second balun (410) to generate third and fourth amplified signals and fifth and sixth amplifiers (418, 420) coupled to outputs of the third balun (412) for respectively amplifying the outputs of the third balun (412) to generate fifth and sixth amplified signals. A fourth balun (422) combines the third and fourth amplified signals into a first combined signal, and a fifth balun (424) combines the fifth and sixth amplified signals into a second combined signal. The amplifier circuit (400) further includes a combiner, such as an additional balun (326) or a summer (430), for combining the first and second combined signals to generate an amplifier output signal.

16 Claims, 5 Drawing Sheets

AMPLIFIER CIRCUIT

FIELD OF THE INVENTION

This invention relates generally to amplifiers, and more specifically to amplifier circuits having low loss.

BACKGROUND OF THE INVENTION

Communication systems, such as cable television systems and broadband communication networks, typically transmit signals over communication media, e.g., copper twisted pair cables, coaxial cable, or fiber optic cable, to receiving equipment. In many communication systems, the receiving equipment can be located far from the transmitting equipment, in which case signal losses can occur. As a result, distribution amplifiers and amplifiers located within other transmission equipment are typically employed to boost signal levels.

At the same time, degradation of overall system performance, which generally results from amplification, should be avoided. The requirements for increasing output power without degrading system performance are in conflict since distortion generally increases as output level increases. Conventional hybrid amplifiers can provide only limited output power at acceptable distortion levels.

Consequently, there exists an opportunity to provide an improved performance hybrid amplifier that provides greater output power levels at acceptable distortion levels.

DETAILED DESCRIPTION OF A PREFERRED EMBODIMENT

Figure 1:
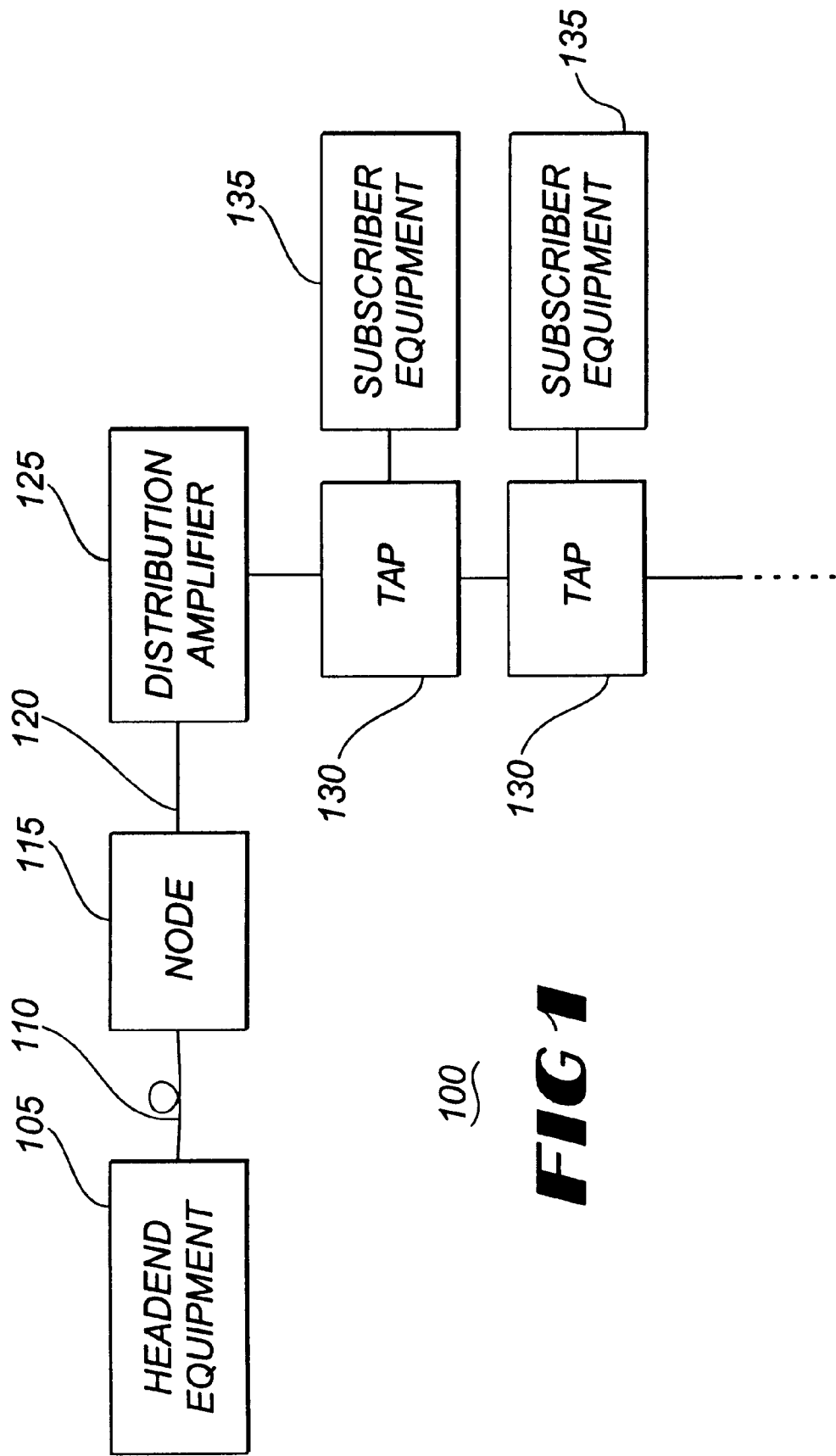
FIG. 1 is a block diagram of a communication system in which signal amplification is desirable.

FIG. 1 illustrates a communication system 100, such as a broadband communication network or a cable television network, that transmits signals for reception by receiving equipment. In a broadband communication network, the transmitting equipment can comprise headend equipment 105 for generating or forwarding communication signals that can, for example, be transmitted as optical signals over a fiber optic communication channel 110. An optical node 115 included within the system 100 converts the optical signals to electrical signals that are further distributed over electrical communication media 120, such as coaxial cable.

As mentioned briefly in the above Background of the Invention, receiving equipment for the signals may be located relatively far away from transmitting equipment, such as the headend equipment 105, in which case one or more distribution amplifiers 125 can be included in the system 100 to boost signal levels of signals that are distributed deeper into the system 100. Amplifiers may also be included at other locations within the system 100, such as within the node 115 or any communication hubs (not shown).

Portions of the amplified signals can, in a subscriber-based system, be split off from the main trunk by taps 130 for transmission to subscriber equipment 135, e.g., televisions, telephones, modems, computers, or set top decoders.

Figure 2:
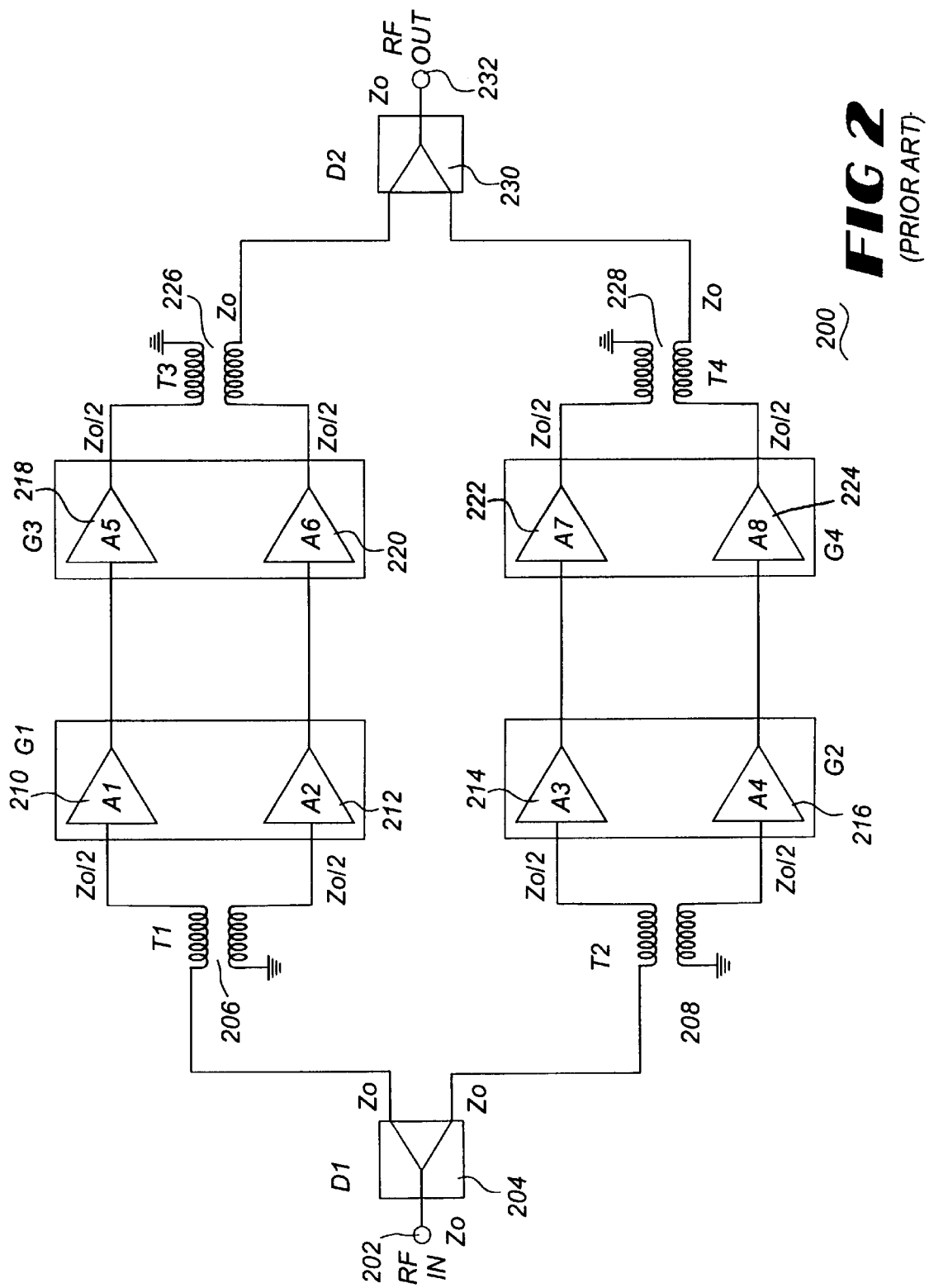
FIG. 2 is an electrical block diagram of a conventional amplifier circuit that can be used in the communication system of FIG. 1.

Referring next to FIG. 2, an electrical block diagram of a conventional hybrid amplifier circuit 200 is shown. The conventional amplifier circuit 200 includes an input port 202 having an impedance of $Z_O$ for receiving an electrical signal, such as a radio frequency (RF) signal that is provided to a divider 204 that outputs two signals that are in phase of phase with each other. A first of the outputs is provided to the input of a first balun T1 206 for dividing the signal into two additional signals that are 180° out of phase with one another. Outputs of balun T1 are amplified, respectively, by first and second amplifiers A1 210 and A2 212 and then by amplifiers A5 218 and A6 220, respectively, to generate first and second amplified signals that are 180° out of phase with one another.

The second output of the divider 204 is provided to the input of a second balun T2 208 for dividing the second divider output into two additional signals that are 180° out of phase with one another. Outputs of balun T2 are amplified, respectively, by amplifiers A3 214 and A4 216 and then by amplifiers A7 222 and A8 224, respectively, to generate third and fourth amplified signals that are 180° out of phase with one another.

Outputs of amplifiers A5 and A6 are combined by balun T3 226. More specifically, since the two inputs to balun T3 are 180° out of phase with one another, balun T3 reverses the phase of one of the signals and then adds the two signals. From a mathematical standpoint, the balun T3 simply subtracts one of its input signals from the other to generate a summed signal and then takes the absolute value of the summed signal to generate a first amplified output signal.

Outputs of amplifiers A7 and A8 are combined by balun T4 228, which generates a second amplified output signal equal in phase to the first amplified output, and then the first and second amplified output signals from T3 and T4 are combined by combiner 230 to generate an amplifier output at output port 232.

Figure 3:
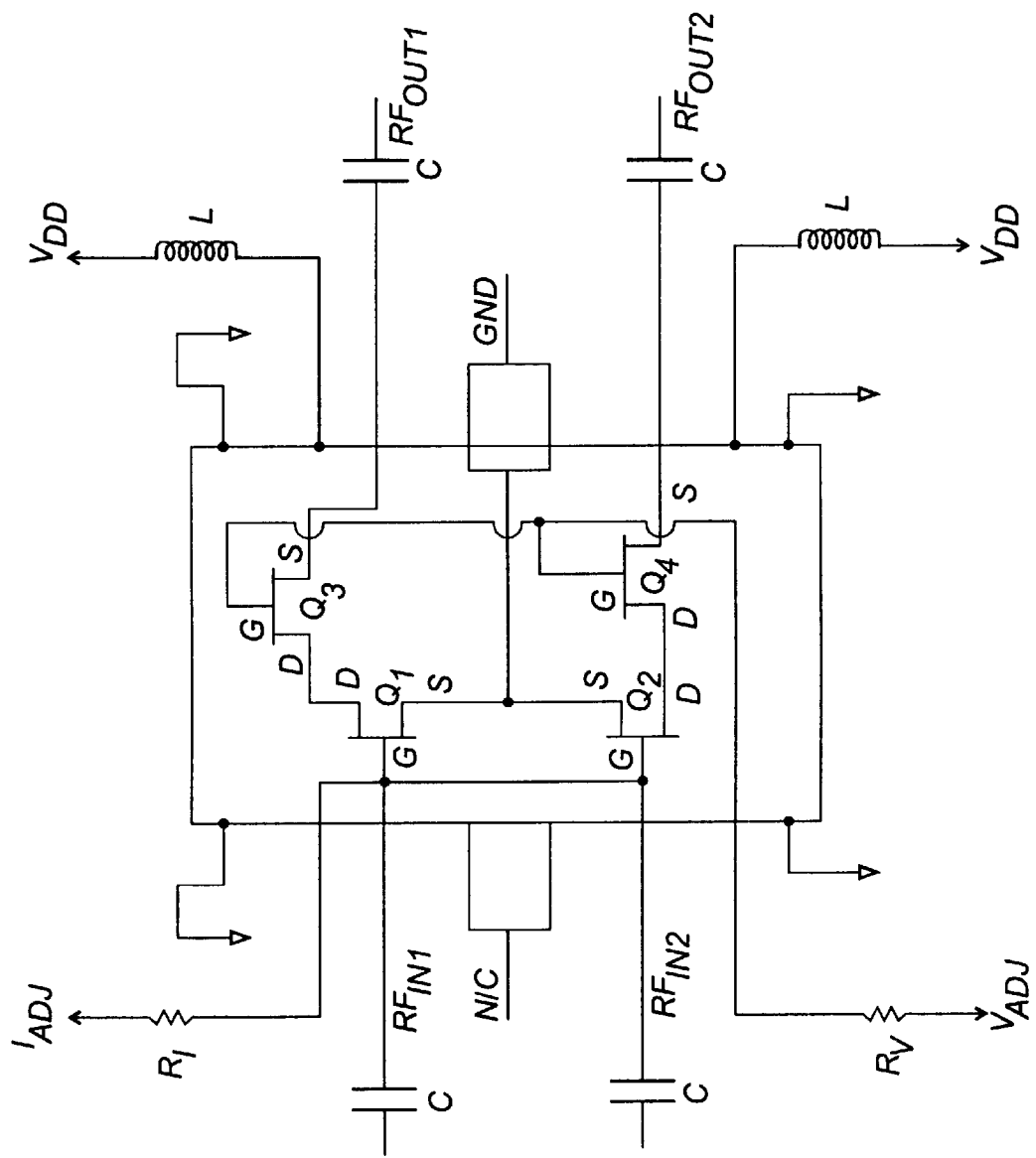
FIG. 3 is an electrical circuit diagram of a gain block included in the conventional amplifier circuit of FIG. 2.

In the prior art circuit 200, each balun T1–T4 is formed from wire coiled around a ferrite core. Additionally, each combiner 230 and divider 204 includes two ferrite cores. As a result, the forward path of each signal within the circuit 200 includes six ferrite cores, each of which introduces loss into the processed signal. In the prior art circuit 200, amplifiers A1 and A2 are included in a single integrated gain block G1, amplifiers A3 and A4 are included in a second integrated gain block G2, and amplifiers A5 and A6 are included in a third integrated gain block G3. The gain blocks could be manufactured by Anadigics, Inc. as part number ACA0861DS7CTR., and a circuit diagram of such a gain block is depicted at FIG. 3.

Figure 4:
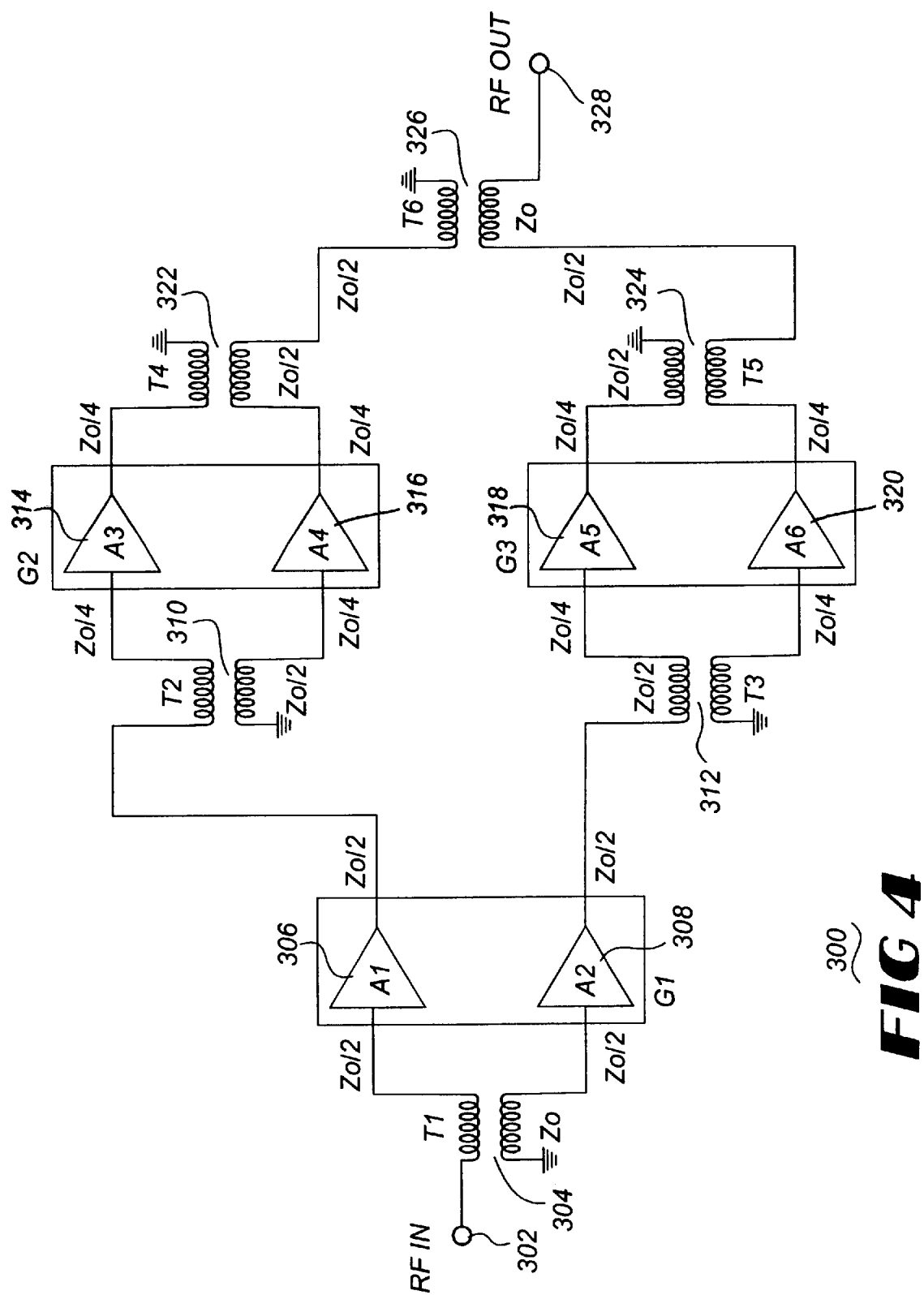
FIG. 4 is an electrical block diagram of a first amplifier circuit that can be used in the communication system of FIG. 1 in accordance with the present invention.

FIG. 4 is an electrical block diagram of an amplifier circuit 300 according to the present invention. The amplifier circuit 300 includes an input port 302 that receives an RF signal and that has an impedance of $Z_O$. A balun T1 304, having an output impedance of $Z_O/2$, splits the signal into two signals that are 180° out of phase with one another, and the split signals are respectively amplified by a first amplifier A1 306 and a second amplifier A2 308. Amplifiers A1 and A2 can be integrated into a single gain block G1 that is manufactured as a single component and that is matched to input and output impedances of $Z_O/2$. The amplified in-phase signal is split by balun T2 310, which has an impedance of $Z_O/2$ to yield an output impedance of $Z_O/4$, into in-phase and out-of-phase signal components. In similar manner, the amplified out-of-phase signal is split by balun T3 312, which also has an impedance of $Z_O/2$ to yield an output impedance of $Z_O/4$, into in-phase and out-of-phase signal components.

The signals provided by balun T2 are respectively amplified by amplifiers A3 314 and A4 316 to generate two amplified signals that are 180° out of phase with one another and that are then combined by balun T4 322 into a single signal in a manner known to one of ordinary skill in the art.

Additionally, the signals provided by balun T3 are respectively amplified by amplifiers A5 318 and A6 320 to generate another two amplified signals that are 180° out of phase with one another and that are combined by balun T5 324 into another single-phase signal. The signals provided by baluns T4 and T5 are, however, 180° out of phase with one another. Therefore, balun T6 is used to combine these signals into a single signal that is provided at an output port 328.

According to the present invention, amplifiers A1 and A2 may be manufactured as a part of a first gain block G1, amplifiers A3 and A4 may be manufactured as a part of a second gain block G2, and amplifiers A5 and A6 may be manufactured as a part of a third gain block G3 similar to G2. Each amplifier should include matching circuitry to match to the desired input and output impedances shown in FIG. 4. $Z_O$ can, for instance, be equal to seventy-five ohms (75 Ω).

The amplifier circuit 300 includes no dividers or combiners other than the baluns T1–T6, each of which includes only a single ferrite core. As a result, the circuit 300 includes only four cores in the path of each processed signal, as compared with six cores in each path of the conventional circuit 200. For the same output level provided by the circuit 300, consequently, levels at the output amplifiers A3–A6 of the conventional circuit 200 have to be higher to compensate for losses introduced by the additional ferrite cores. This, in turn, worsens the distortion performance of the prior art circuit 200 and any device in which it may be included. Furthermore, in the prior art amplifier circuit 200, the signal levels at the outputs of amplifiers A1 and A2 have to be higher than corresponding amplifiers of the circuit 300 to overcome the losses of dividers 210, 212, which means that more power will have to be dissipated in the prior art amplifier circuit 200 in order to maintain a distortion level equivalent to that of the amplifier circuit 300 according to the present invention.

Figure 5:
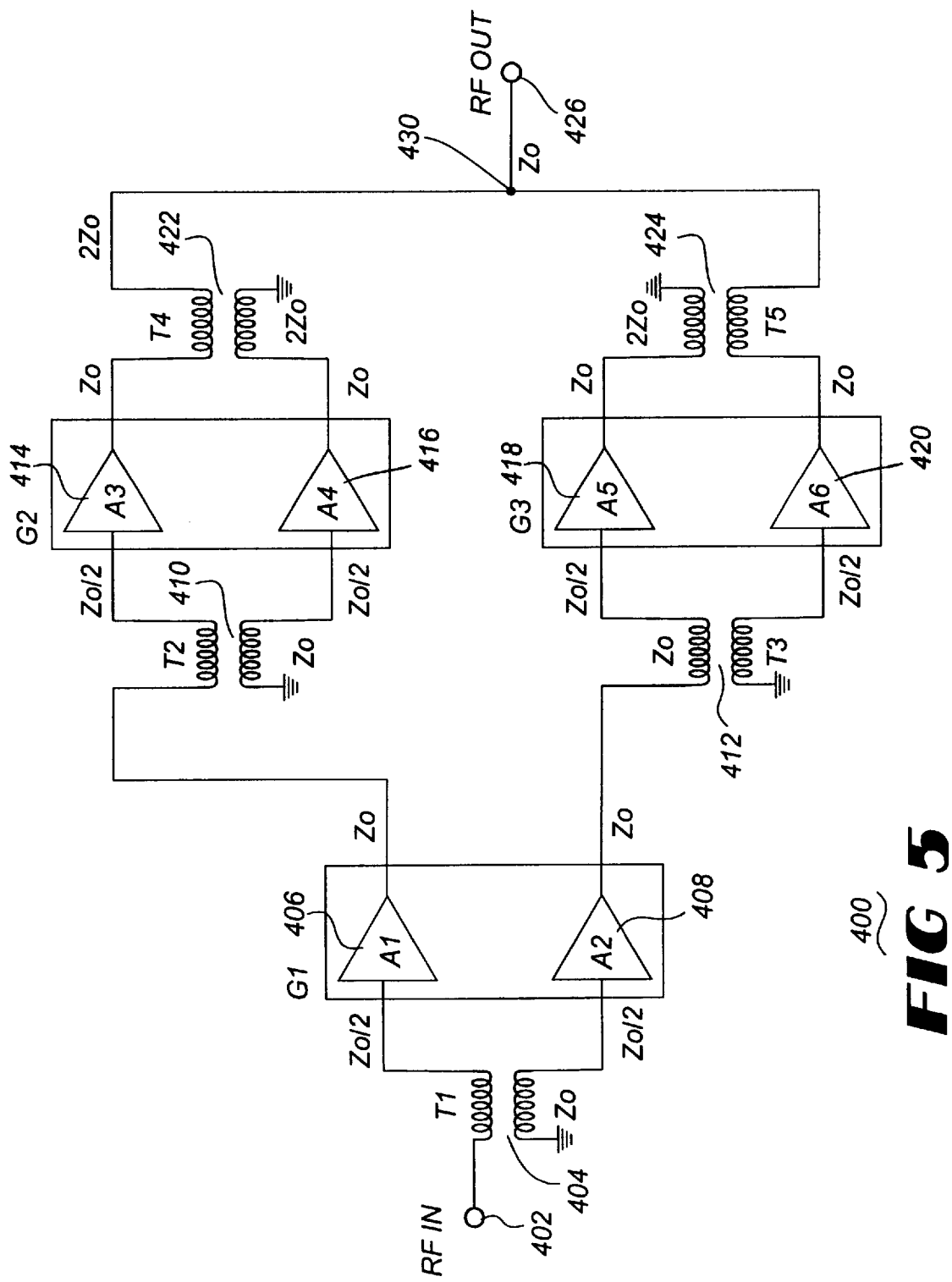
FIG. 5 is an electrical block diagram of a second amplifier circuit that can be used in the communication system of FIG. 1 in accordance with the present invention.

Referring next to FIG. 5, a second amplifier circuit 400 according to the present invention is depicted. The amplifier circuit 400 includes an input port 402 for receiving an RF signal that is split by balun T1 404 into components that are 180° out of phase with one another and that are respectively amplified by amplifiers A1 406 and A2 408. The output of amplifier A1 is further split by balun T2 410 into separate components that are also 180° out of phase with one another, and these separate components are amplified, respectively, by amplifiers A3 414 and A4 416. Outputs of amplifiers A3 and A4 are combined by balun T4 422 to provide a single signal, all components of which are in phase with one another.

The output of amplifier A2 is, in similar manner, split by balun T3 412 into separate components that are 180° out of phase with one another, and the separate components provided by balun T3 are amplified, respectively, by amplifiers A5 418 and A6 420. Outputs of amplifiers A5 and A6 are combined by balun T5 424 to provide another single signal including components that are all in phase with one another.

Referring to FIG. 4 in conjunction with FIG. 5, it can be seen that balun T4 of circuit 300 and balun T4 of circuit 400 have opposite leads connected to ground and, consequently, provide outputs that are equal in amplitude but opposite in phase. As a result, the baluns T4 and T5 of amplifier circuit 400 provide outputs that have the same phase and can be simply summed, such as by a summer at node 430, and provided to an output port 426.

According to the present invention, within circuit 400, amplifiers A1 and A2 may be manufactured as a part of a first gain block G1, amplifiers A3 and A4 may be manufactured as a part of a second gain block G2, and amplifiers A5 and A6 may be manufactured as a part of a third gain block G3. Each amplifier should include matching circuitry to match to the desired input and output impedances shown in FIG. 5. $Z_O$ can, for instance, be equal to seventy-five ohms (75 Ω).

Since each balun of circuit 400 includes only a single ferrite core, it will be appreciated that the circuit 400 includes only three (3) ferrite cores for each signal path, as compared with four (4) cores per path in circuit 300 and six (6) cores per path in conventional circuit 200. The circuit 400 is therefore the least lossy and can provide output levels as high as those provided by the other amplifier circuits discussed above, but with better distortion performance.

It will be appreciated by now that the amplifier circuits described above in accordance with the present invention provide better performance, with less distortion, than prior art amplifier circuits.

What is claimed is:

1. An amplifier circuit comprising:

an input port for receiving a signal;

a first balun for splitting the signal into first and second signals;

first and second amplifiers coupled to outputs of the first balun for respectively amplifying the outputs of the first balun to generate first and second amplified signals;

second and third baluns coupled, respectively, to outputs of the first and second amplifiers for splitting, respectively, each of the first and second amplified signals into in-phase and out-of-phase components;

third and fourth amplifiers coupled to outputs of the second balun for respectively amplifying the outputs of the second balun to generate third and fourth amplified signals;

fifth and sixth amplifiers coupled to outputs of the third balun for respectively amplifying the outputs of the third balun to generate fifth and sixth amplified signals;

a fourth balun for combining the third and fourth amplified signals into a first combined signal;

a fifth balun for combining the fifth and sixth amplified signals into a second combined signal; and combining means for combining the first and second combined signals to generate an amplifier output signal.

2. The amplifier circuit of claim 1, further comprising:

an output port coupled to an output of the combining means.

3. The amplifier circuit of claim 1, wherein the first and second amplifiers are included in a single gain block.

4. The amplifier circuit of claim 1, wherein the third and fourth amplifiers are included in a single gain block.

5. The amplifier circuit of claim 1, wherein the fifth and sixth amplifiers are included in a single gain block.

6. The amplifier circuit of claim 1, wherein the first and second signals provided by the first balun are 180° out of phase with one another.

7. The amplifier circuit of claim 6, wherein outputs of the second balun are 180° out of phase with one another.

8. The amplifier circuit of claim 7, wherein outputs of the third balun are 180° out of phase with one another.

9. The amplifier circuit of claim 8, wherein the first combined signal provided by the fourth balun is 180° out of phase with the second combined signal provided by the fifth balun.

10. The amplifier circuit of claim 9, wherein the combining means comprises a sixth balun for combining the first combined signal and the second combined signal to generate the amplifier output signal.

11. The amplifier circuit of claim 10, wherein the amplifier circuit is characterized by an input impedance of $Z_O$ and by an output impedance of $Z_O$.

12. The amplifier circuit of claim 11, wherein:

the first and sixth baluns are each characterized by an impedance of $Z_O$; and the second, third, fourth and fifth baluns are each characterized by an impedance of $Z_O/2$.

13. The amplifier circuit of claim 8, wherein the first combined signal provided by the fourth balun is the same phase as the second combined signal provided by the fifth balun.

14. The amplifier circuit of claim 13, wherein the combining means comprises a summer for combining the first combined signal and the second combined signal to generate the amplifier output signal.

15. The amplifier circuit of claim 14, wherein the amplifier circuit is characterized by an input impedance of $Z_O$ and by an output impedance of $Z_O$.

16. The amplifier circuit of claim 15, wherein:

the first, second, and third baluns are each characterized by an impedance of $Z_O$; and the fourth and fifth baluns are each characterized by an impedance of $2Z_O$b.

\* \* \* \* \*